United States Patent [19]

Hagen

[11] Patent Number: 5,856,065
[45] Date of Patent: Jan. 5, 1999

[54] NEGATIVE WORKING PHOTORESIST COMPOSITION BASED ON POLYIMIDE PRIMERS

[75] Inventor: Sigurd Guenter Hagen, Binzen, Germany

[73] Assignee: Olin Microelectronic Chemicals, Inc., Norwalk, Conn.

[21] Appl. No.: 800,319

[22] Filed: Feb. 14, 1997

[30] Foreign Application Priority Data

Mar. 27, 1996 [CH] Switzerland ............... 0800/96

[51] Int. Cl.$^6$ ............... G03F 7/038; G03F 7/30
[52] U.S. Cl. ............... 430/283.1; 522/77; 522/99; 522/136; 522/142; 430/325; 430/311; 430/330
[58] Field of Search ............... 430/283.1, 325, 430/311, 330; 522/77, 99, 136, 142

[56] References Cited

U.S. PATENT DOCUMENTS

| | | | |
|---|---|---|---|
| 3,552,973 | 1/1971 | Fishman | 96/90 |
| 4,366,228 | 12/1982 | Specht et al. | 430/281.1 |
| 4,366,230 | 12/1982 | Ahne et al. | 430/325 |
| 4,371,685 | 2/1983 | Ahne et al. | 430/281.1 X |
| 4,515,887 | 5/1985 | Davis | 430/283.1 |
| 4,579,809 | 4/1986 | Irving | 430/283.1 |
| 4,604,342 | 8/1986 | Sondergeld et al. | 430/283.1 X |
| 5,019,482 | 5/1991 | Ai et al. | 430/283.1 |
| 5,302,489 | 4/1994 | Shu | 430/191 |

FOREIGN PATENT DOCUMENTS

| | | |
|---|---|---|
| 0 107 621 A1 | 10/1983 | European Pat. Off. . |
| 0 119 162 | 9/1984 | European Pat. Off. . |
| 0 624 826 | 11/1994 | European Pat. Off. . |
| 2 308 830 | 8/1974 | Germany . |
| 2 437 348 | 2/1976 | Germany . |
| 3170 551 A | 7/1991 | Japan . |
| WO93/09470 | 5/1993 | WIPO . |

OTHER PUBLICATIONS

K.K. Dietliker in "Chemistry and Technology of UV & EB Formulation for Coatings, Inks and Paints", vol. III: Photoinitiators For Free Radical And Cationic Polymerization, pp. 115–352.

Chem. Rev. 1993, "Photoinitiators For Free–Radical–Initiated Photoimaging Systems", pp. 435–448.

*Primary Examiner*—Cynthia Hamilton
*Attorney, Agent, or Firm*—Ohlandt, Greeley, Ruggiero & Perle

[57] ABSTRACT

Negative working photoresist compositions containing:
  a) a polyimide primer containing recurring structural units of formula (I) in the specification as well as
  b) a photoinitiator for polymerizing olefin double bonds, which are characterized by in that they contain
  at least one other component c), which is selected from the group consisting of
  c1) organosilicon compounds with one or more hydroxyl groups,
  c2) compounds of formula (IIa) in the specification,
  c3) compounds of formula (IIb) as in the specification,
  c4) mixtures comprised of two or more components selected from components of c1), c2) and c3),
  have the advantage that they can be developed with a developer, which comprises up to 50 to 100 wt. % of an aqueous-alkaline medium, whereby the balance to 100 wt. % is formed by one or more organic solvents.

18 Claims, No Drawings

NEGATIVE WORKING PHOTORESIST COMPOSITION BASED ON POLYIMIDE PRIMERS

BACKGROUND OF THE INVENTION

1. Field of the Invention

The present application concerns improved negative working photoresist compositions containing a) a polyimide primer (i.e. precursor) containing recurring structural units of formula (I)

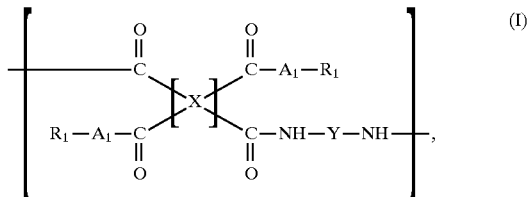

in which $A_1$ stands for an oxygen atom or an NH group, $R_1$ represents the same or different residues with at least one photopolymerizable olefin double bond, [X] indicates the residue of the cyclic dianhydride of the same or different tetracarboxylic acids remaining after removal of the anhydride groups, and Y indicates the residue of the same or different diamines remaining after removal of the amino groups, as well as b) a photoinitiator for polymerizing olefin double bonds.

2. Brief Description of Relevant Art

Photoresists of the initially known type have already been known for a long time and are described, for example, in DE-A-2,308,830; DE-A 2,437,348; EP-A-0 119,162, or EP-A-0 624,826. The named photoresist compositions are crosslinked upon action of irradiation of suitable wavelength by means of the photopolymerizable olefin double bonds in the polyimide primer and thus represent negative resists. The named resists have a very high sensitivity and show only a small amount of dark material removed during development. Further, they have the advantage that a coating that is prepared with their help can be transformed into a polyimide coating after exposure and developing by firing, whereby the coating is particularly heat resistant. However, a disadvantage is that such negative resists must be treated beforehand with developers that consist almost completely of organic solvents, which, of course, is not desirable due to the expenditures associated therewith for environmentally compatible disposal as well as for reasons of inflammability.

On the other hand, aqueous-alkaline developable positively operating photoresists based on polyimide primers, including those of above formula (I), are described in WO-A-93/09470. The compositions also contain, as aqueous-alkaline developable photoresists, compounds that decompose under the effect of radiation into components that are soluble in alkali, particularly 1,2-diazoquinone derivatives, as have been used for a long time in commercial positive resists based on novolak resins. In order to improve their developability in aqueous-alkaline media, the named positive photoresist compositions also contain solubility reinforcers, particularly hydroxy compounds, which essentially increase the solubility of the irradiated resist parts in the developer, but the solubility of the unexposed resist parts is only slightly increased or is not increased at all. Particularly preferred solubility reinforcers are organosilanols, such as triphenylsilanol, diphenylsilanediol, and 1,4-bis(hydroxydimethylsilyl)benzene, as well as organosiloxanes with free hydroxyl groups, such as 1,3-bis(4-hydroxybutyl)-tetramethyldisiloxane.

One task of the present invention is to make available a negative working photoresist composition based on polyimide primers or precursors of the above named formula (I), which makes possible, under the usual conditions of practice, the use of developers that comprise aqueous-alkaline media.

BRIEF SUMMARY OF THE INVENTION

According to the invention, this task is resolved by making available a negative working photoresist composition, containing:

a) a polyimide primer containing recurring structural units of formula (I)

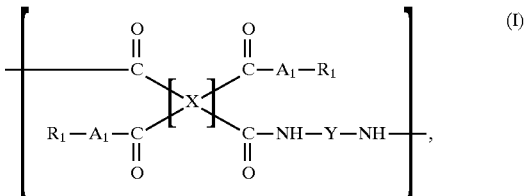

in which $A_1$ stands for an oxygen atom or an NH group, $R_1$ represents the same or different residues with a photopolymerizable olefin double bond,

[X] indicates the residue of the cyclic dianhydride of the same or different tetracarboxylic acids remaining after removal of the anhydride groups, and Y indicates the residue of the same or different diamines remaining after removal of the amino groups, as well as b) a photoinitiator for polymerizing olefin double bonds, which is further characterized by at least one other component, c) which is selected from the group consisting of c1) organosilicon compounds with one or more hydroxyl groups, c2) compounds of formula (IIa)

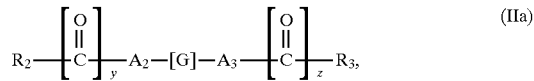

in which $A_2$ and $A_3$, independent of one another, stand for an oxygen atom or a NR group, in which R indicates a hydrogen atom or a $C_1$-$C_4$ alkyl group, and

[G] stands for a divalent aliphatic or aromatic group, which is unsubstituted or has one or more hydroxyl substituents, $R_2$ indicates an aryl residue, which has one or more substituents that improve the solubility of the composition in aqueous-alkaline media, $R_3$ represents a residue with at least one photopolymerizable olefin double bond, and y as well as z, independent of one another, indicate the number 0 or 1, c3) compounds of formula (IIb)

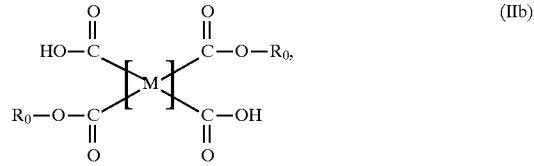

in which $R_0$ represents the same or different residues with a photopolymerizable olefin double bond, and

[M] represents the residue of the cyclic dianhydride of a tetracarboxylic acid after removal of the anhydride groups, and c4) mixtures consisting of two or more components selected from components of type c1), type c2), and type c3).

The compositions according to the invention are free of substances that decompose into components soluble in alkali under the effect of radiation, and particularly they are free of the corresponding 1,2-diazoquinone derivatives, as they are described, for example, in WO-A-93/09470.

DETAILED DESCRIPTION OF PREFERRED EMBODIMENTS

Preferred organosilicon compounds c1) are selected from organosilanols and organosiloxanes, each of which have one or two hydroxyl groups, particularly from the group comprising triphenylsilanol, diphenylsilanediol, 1,4-bis(hydroxydimethylsilyl)benzene and 1,3-bis(4-hydroxybutyl)tetramethyldisiloxane.

The compounds of formula (IIa) contain an aryl residue as residue $R_2$, preferably with 6 to 14 ring carbon atoms, each of which has one or more substituents that improve the solubility of the composition in aqueous-alkaline media, particularly an appropriately substituted phenyl residue. In principle, any acid residue can be used for the substituent at the aryl residue, e.g., sulfonic acid residue, HOOC residues or HO residues. A preferred form of embodiment of the compositions according to the invention has as component c2) compounds of formula (IIa), in which $R_2$ indicates a phenyl residue, which has one to three substituents, selected from HO— and HOOC— substituents. Very particularly preferred as compounds of formula (IIa) are those in which $R_2$ stands for a group selected from the groups of the following formulas:

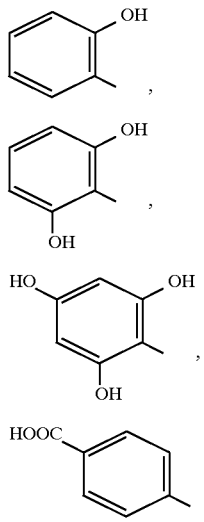

and

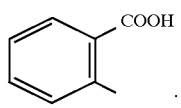

If [G] indicates a divalent aliphatic group in the compounds of formula (IIa), then we are dealing appropriately with a $C_1$–$C_{10}$ alkylene group, preferably a $C_2$–$C_6$ alkylene group, particularly a straight-chain $C_2$–$C_6$ alkylene group, e.g., an ethylene, trimethylene, or tetramethylene group, which is either unsubstituted or has one or more hydroxyl substituents. Very well suitable for the purpose of the present invention are, e.g., compounds of formula IIa), in which [G] stands for a group of formula

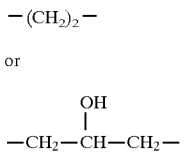

If [G] indicates a divalent aromatic group for compounds of formula (IIa) then this preferably contains 6 to 20 ring carbon atoms, whereby two or more aromatic rings can be bridged in the group, if necessary, by means of bridge members, e.g., by means of $C_1$–$C_4$ alkylene groups, especially by means of a group of formula —$CH_2$— or >$C(CH_3)_2$, or by means of >C=O or an oxygen atom.

The residue $R_3$ in formula (IIa) particularly comprises $C_2$–$C_6$ alkenyl groups, whereby vinyl and isopropenyl groups are particularly preferred.

Preferred examples for compounds of formula (IIa), include:

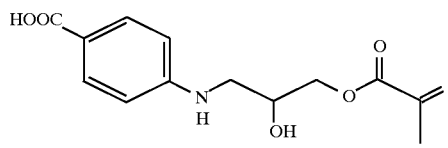

as well as, in particular, compounds of formula (IIa), in which $A_2$ and $A_3$ both stand for an oxygen atom and in which y and z both indicate the number 1, e.g.:

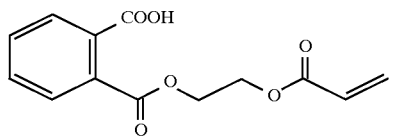

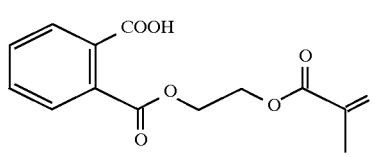

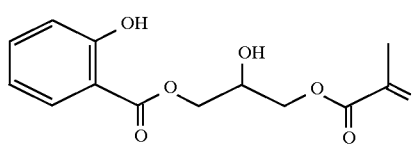

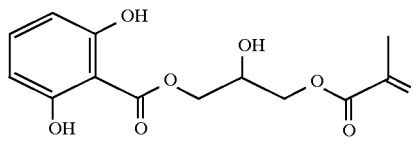

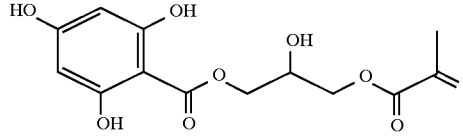

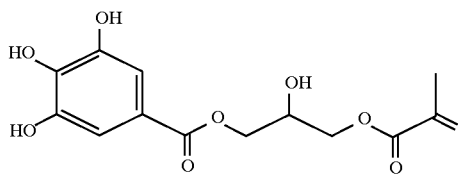

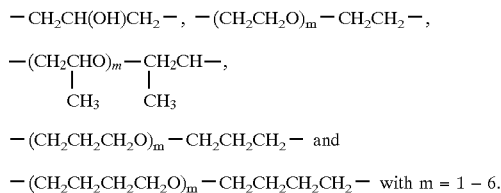

with m = 1 – 6.

$R_5$ is preferably ethylene, propylene, trimethylene, or —$CH_2CH(OH)CH_2$—, and $R_4$ is preferably methyl.

Particularly preferred is $R_1$, a residue of formula (III), in which $R_4$ indicates methyl and $R_5$ stands for ethylene.

A special example of a compound of formula (IIb) is:

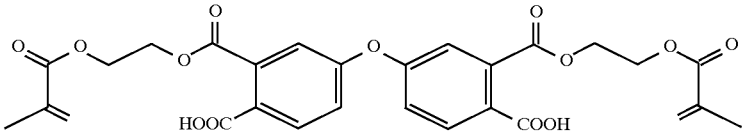

The group [M] may represent the residue of one of the following dianydrides for compounds of formula (IIb), e.g., after removal of the anhydride groups: pyromellitic acid dianhydride (=PMDA), 3,3',4,4'-biphenyltetracarboxylic acid dianhydride, 3,3',4,4'-diphenylsulfidetetracarboxylic acid dianhydride, 3,3',4,4'-diphenylsulfonetetracarboxylic acid dianhydride, 3,3',4,4'-benzophenone tetracarboxylic acid dianhydride, 3,3',4,4'-diphenylmethanetetracarboxylic acid dianhydride, 2,2',3,3'-diphenylmethanetetracarboxylic acid dianhydride, 2,3,3',4'-biphenyltetracarboxylic acid dianhydride, 2,3,3',4'-benzophenonetetracarboxylic acid dianhydride, dianhydrides of oxydiphthalic acids, particularly 3,3',4,4'-diphenyloxidetetracarboxylic acid dianhydride (4,4'-oxydiphthalic acid dianhydride), 2,3,6,7-naphthalenetetracarboxylic acid dianhydride, 1,4,5,7-naphthalenetetracarboxylic acid dianhydride, 2,2-bis(3,4-dicarboxyphenyl)propane dianhydride, 2,2-bis(2,3-dicarboxyphenyl)propane dianhydride, 2,2-bis(3,4-dicarboxyphenyl)hexafluoropropane dianhydride, 1,3-diphenylhexafluoropropane-3,3,4,4-tetracarboxylic acid dianhydride, 1,4,5,6-naphthalenetetracarboxylic dianhydride, 2,2',3,3'-diphenyltetracarboxylic acid dianhydride, 3,4,9,10-perylenetetracarboxylic acid dianhydride, 1,2,4,5-naphthalenetetracarboxylic acid dianhydride, 1,4,5,8-naphthalenetetracarboxylic acid dianhydride, 1,8,9,10-phenanthrenetetracarboxylic acid dianhydride, 1,1-bis(2,3-dicarboxyphenyl)ethane dianhydride, 1,1-bis(3,4-dicarboxyphenyl)ethane dianhydride, 1,2,3,4-benzenetetracarboxylic acid dianhydride, or represent their $C_1$–$C_6$ alkyl and $C_1$–$C_6$ alkoxy derivatives. These compounds are known and may partly be obtained commercially. Mixtures of dianhydrides, such as those named, may also be used.

The group $R_0$ in formula (IIb) indicates, e.g., vinyl, allyl, methallyl, or a residue of formula (III):

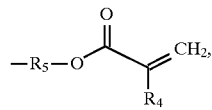

in which
$R_4$ indicates hydrogen or methyl and
$R_5$ stands for —$C_nH_{2n}$— with n=2–12, —$CH_2CH(OH)CH_2$— or polyoxyalkylene with 4–30C atoms.

Examples of suitable residues $R_5$ include ethylene, propylene, trimethylene, tetramethylene, 1,2-butanediyl, 1,3-butanediyl, pentamethylene, hexamethylene, octamethylene, dodecamethylene, Both component c1) as well as also components c2) and c3) are preferably contained in a quantity of up to 30 wt. % in the compositions according to the invention, whereby this value each time is referred to the total weight of components a)+c) in the composition. Preferably, the lower limit for the content of at least one of the two components c1), c2), or c3) lies at 5 wt. %, and preferably at 10 wt. % relative to the total weight of components a)+c). Compounds of the type c1) and c2) are preferred as component c).

A particularly preferred form of embodiment of the negative resist compositions according to the invention is characterized by the fact that it contains a special mixture of type c4) as component c), wherein said mixture comprises at least one component of type c1) as well as at least one component of type c2). The mixtures are preferably contained in a quantity of 25 to 45 wt. % relative to the total weight of components a)+c) in the compositions of the invention. The component of type c1) is preferably a silanediol, such as diphenylsilanediol.

Polyimide primers of formula (I) are known and are described, among others, in the above-named Offenlegungsschrift [Unexamined] Specifications DE-A-2,308,830; DE-A-2,437,348; EP-A-0 119,162; and EP-A-0 624,826, each of which is incorporated herein by reference in their entireties. Particularly well suited for the present invention are the polyimide primers that are disclosed in EP-A-0 624,826, which is also incorporated herein by reference in its entirety, apply to the present invention.

The group [X] may represent e.g. the residue of one or different ones of the following dianhydrides remaining after the removal of the anhydride groups, for the photoreactive polyimide primers suitable for the present invention: pyromellitic acid anhydride (=PMDA), 3,3',4,4'-biphenyltetracarboxylic acid dianhydride, 3,3',4,4'-diphenylsulfidetetracarboxylic acid dianhydride, 3,3',4,4'-diphenylsulfonetetracarboxylic acid dianhydride, 3,3',4,4'-benzophenone-tetracarboxylic acid dianhydride, 3,3',4,4'-diphenylmethanetetracarboxylic acid dianhydride, 2,2',3,3'-diphenylmethanetetracarboxylic acid dianhydride, 2,3,3',4'-biphenyltetracarboxylic acid dianhydride, 2,3,3',4'-benzophenonetetracarboxylic acid dianhydride, dianhydrides of oxydiphthalic acids, particularly 3,3',4,4'- diphenyloxidetetracarboxylic acid dianhydride (4,4'-oxydiphthalic acid dianhydride), 2,3,6,7-naphthalenetetracarboxylic acid dianhydride, 1,4,5,7-naphthalenetetracarboxylic acid dianhydride, 2,2-bis(3,4-dicarboxyphenyl)-propane dianhydride, 2,2-bis(2,3-dicarboxyphenyl)propane dianhydride, 2,2-bis(3,4-dicarboxyphenyl)hexafluoropropane dianhydride, 1,3-diphenylhexafluoropropane-3,3,4,4-tetracarboxylic acid dianhydride, 1,4,5,6-naphthalenetetracarboxylic acid dianhydride, 2,2',3,3'-diphenyltetracarboxylic acid dianhydride, 3,4,9,10-perylenetetracarboxylic acid dianhydride, 1,2,4,5-naphthalenetetracarboxylic acid dianhydride, 1,4,5,8-naphthalenetetracarboxylic acid dianhydride, 1,8,9,10-phenanthrenetetracarboxylic acid dianhydride, 1,1-bis(2,3-dicarboxyphenyl)ethane dianhydride, 1,1-bis(3,4-dicarboxyphenyl)ethane dianhydride, 1,2,3,4-benzenetetracarboxylic acid dianhydride, or represent their $C_1$–$C_6$ alkyl and $C_1$–$C_6$ alkoxy derivatives. These compounds are known and can partly be obtained commercially. Mixtures of dianhydrides, as those named, may also be used.

Group Y can represent the residue of the same or different aliphatic, cycloaliphatic, or aromatic diamines remaining after the removal the amino groups, e.g., of the following: 1,2-diaminoethane, 1,2-diaminopropane, 1,3-diaminocyclopropane, 1,4-diaminobutane and 1,6-diaminohexane; 1,2- or 1,3-diaminopentane, 1,2-, 1,3- or 1,4-diaminocyclohexane, 1,2- 1,3- or 1,4-bis(aminomethyl)cyclohexane, bis-(4-aminocyclohexyl)methane, bis-(3-aminocyclohexyl)methane, 4,4'-diamino-3,3'-dimethylcyclohexylmethane and isophoronediamine; m- and p-phenylenediamine, diaminotoluene, 4,4'- and 3,3'-diaminobiphenyl, 4,4'- and 3,3'-diaminodiphenyl ether, 4,4'- and 3,3'-diaminodiphenylmethane, 4,4'- and 3,3'-diaminodiphenylsulfone, 4,4'- and 3,3'-diaminodiphenylsulfide, 4,4'- and 3,3'-diaminobenzophenone, 3,3'-dimethyl-4,4'-diaminobiphenyl, 2,2'-dimethyl-4,4'-diaminobiphenyl, 3,3'-dimethoxy-4,4'-diaminobiphenyl, 2,2-bis(4-aminophenyl)propane, 2,2-bis(4-aminophenyl)hexafluoropropane, 2,2-bis(3-hydroxy-4-aminophenyl)propane, 2,2-bis(3-hydroxy-4-aminophenyl)hexafluoropropane, 4,4'-diaminoparaterphenyl, 4,4-bis(4-aminophenoxy)biphenyl, bis[4-(4-aminophenoxy)phenyl]sulfone, bis[4-(3-aminophenoxy)phenyl]sulfone, bis[4-(2-aminophenoxy)phenyl]sulfone, 1,4-bis(4-aminophenoxy)benzene, 9,10-bis(4-aminophenyl)anthracene, 3,3'-dimethyl-4,4'-diaminodiphenylsulfone, 1,3-bis(4-aminophenoxy)benzene, 1,3-bis(3-aminophenoxy)benzene, 1,3-bis(4-aminophenyl)benzene, bis[4-(4-aminophenoxy)phenyl ether, 3,3'-diethyl-4,4'-diaminodiphenylmethane, 3,3'-dimethyl-4,4'-diaminodiphenylmethane, 4,4'-diaminooctafluorobiphenyl, 2,2-bis[4-(4-aminophenoxy)phenyl]propane, 2,2-bis[4-(4-aminophenoxy)phenyl]hexafluoropropane, 2,2-bis(4-aminophenyl)hexafluoropropane, 9,9-bis(4-aminophenyl)-10-hydroanthracene, 3,3',4,4'-tetraaminobiphenyl, 3,3',4,4'-tetraaminodiphenyl ether, 1,4-diaminoanthraquinone, 1,5-diaminoanthraquinone, bis[4-(4-aminophenoxy)phenyl]sulfone, bis[4-(3-aminophenoxy)phenyl]sulfone, bis[4-(2-aminophenoxy)phenyl]sulfone, 3,3-dihydroxy-4,4'-diaminobiphenyl, 9,9'-bis(4-aminophenyl)fluorene, 4,4'-dimethyl-3,3'-diaminodiphenylsulfone, 3,3',5,5'-tetramethyl-4,4'-diaminodiphenylmethane, 2,4- and 2,5-diaminocumene, 2,5-dimethyl-p-phenylenediamine, acetylguanamine, 2,3,5,6-tetramethyl-p-phenylenediamine, 2,4,6-trimethyl-m-phenylenediamine, bis(3-aminopropyl)tetramethyldisiloxane, 2,7-diaminofluorene, 2,5-diaminopyridine, 1,2-bis(4-aminophenyl)ethane, diaminobenzanilide, esters of diaminobenzoic acid, 1,5-diaminonaphthalene, diaminobenzotrifluoride, diaminoanthraquinone, 1,3-bis(4-aminophenyl)hexafluoropropane, 1,4-bis(4-aminophenyl)octafluorobutane, 1,5-bis(4-aminophenyl)decafluoropentane, 1,7-bis(4-aminophenyl)tetradecafluoroheptane, 2,2-bis[4-(3-aminophenoxy)phenyl]hexafluoropropane, 2,2-bis[4-(2-aminophenoxy)phenyl]hexafluoropropane, 2,2-bis[4-(4-aminophenoxy)-3,5-dimethylphenyl]hexafluoropropane, 2,2-bis[4-(4-aminophenoxy)-3,5-bis(trifluoromethyl)-phenyl]hexafluoropropane, p-bis(4-amino-2-trifluoromethylphenoxy)benzene, 4,4'-bis(4-amino-2-trifluoromethylphenoxy)biphenyl, 4,4'-bis(4-amino-3-trifluoromethylphenoxy)biphenyl, 4,4'-bis(4-amino-2-trifluoromethylphenoxy)diphenylsulfone, 4,4'-bis(3-amino-5-trifluoromethylphenoxy)diphenylsulfone, 2,2-bis[4-(4-amino-3-trifluoromethylphenoxy)-phenyl]hexafluoropropane, 3,3',5,5'-tetramethyl-4,4'-diaminobiphenyl, 3,3'-dimethoxy-4,4'-diaminobiphenyl, 2,2',5,5',6,6'-hexafluorotolidine and 4,4'"-diaminoquaterphenyl.

The polyimide primer of the compositions of the invention may contain, in addition to recurring structural units of formula (I), which are all based on one type of group [X] or group Y, also structural units of formula (I), which are based on two or more different types of these groups. Further, the polyimide primer can also contain structural units of units of formula (I), which are structural isomers of one another. How structural isomer pairs of units of formula (I) appear is represented in the following for the example of units of formula (I) that derive from pyromellitic acid as group [X] ($A_1$=—O—):

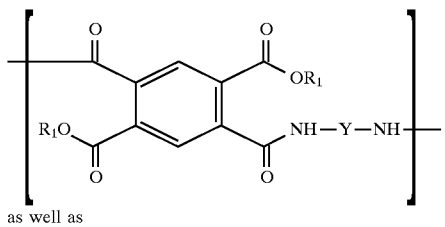

as well as

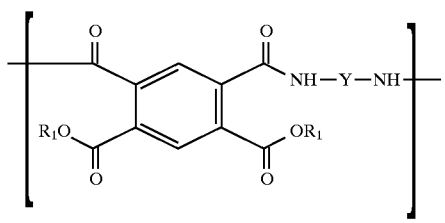

$A_1$ preferably represents an oxygen atom in formula (I), $R_1$ indicates in formula (I), e.g., vinyl, allyl, methallyl, or stands for a residue of formula (III)

(III)

in which $R_4$ indicates hydrogen or methyl and $R_5$ stands for —$C_nH_{2n}$— with n=2–12, —$CH_2CH(OH)CH_2$— or polyoxyalkylene with 4–30C atoms.

Examples of suitable residues $R_5$ include ethylene, propylene, trimethylene, tetramethylene, 1,2-butanediyl, 1,3-butanediyl, pentamethylene, hexamethylene, octamethylene, dodecamethylene, $-CH_2CH(OH)CH_2-$, $-(CH_2CH_2O)_m-CH_2CH_2-$,

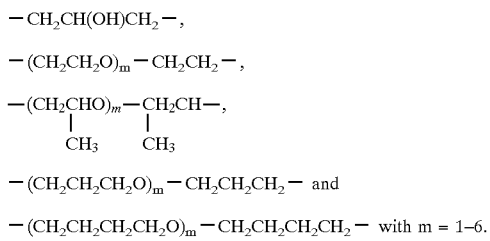

$-(CH_2CH_2CH_2O)_m-CH_2CH_2CH_2-$ and $-(CH_2CH_2CH_2CH_2O)_m-CH_2CH_2CH_2CH_2-$ with m = 1–6.

$R_5$ is preferably ethylene, propylene, trimethylene, or $-CH_2CH(OH)CH_2-$, and $R_4$ is preferably methyl.

Particularly preferred is $R_1$, a residue of formula (III), in which $R_4$ indicates methyl and $R_5$ stands for ethylene.

The polyimide primers of the compositions of the invention may contain other repeating structural units in addition to the above-described recurring structural units of formula (I), as long as the proportion of units of formula (I) in the polymer is sufficiently high in order to assure that at least 50% of the original thickness of the resist coating is present after development of the exposed regions of the resists (50% retention of layer thickness in development).

The average molecular weight (weight average $M_w$) of the photoreactive polyimide primers or precursors preferably amounts to 1,000 to 100,000, particularly 3,000 to 50,000 and very particularly preferred 5,000 to 30,000. The weight average $M_w$ of a specific photoreactive polyimide primer can be determined, e.g., with the help of gel permeation chromatography with polystyrene calibration.

The photoreactive polyimide primers or precursors may be produced according to known methods, for example, according to the method that is referred to in EP-A-0 624,826.

As photoinitiator component b), in principle, all photoinitiators known to the ordinary skilled artisen may be employed, which have a sufficiently high sensitivity in the region of the wavelengths to which the resist composition will be sensitive. Examples of such photoinitiators are, e.g., given by K. K. Dietliker in "Chemistry and Technology of UV & EB Formulation for Coatings, Inks and Paints", Volume 3: "Photoinitatiors for Free Radical and Cationic Polymerization". For example, the following are suitable: benzoin ethers, such as e.g., benzoin methyl ether; ketals, such as, diethoxyacetophenone or benzildimethylketal, hexaarylbisimadazole; quinones, such as e.g., 2-tert-butylanthraquinone; or thioxanthones, which are utilized preferably in combination with amine coinitiators, such as, for example, thioxanthone, 2-isopropylthioxanthone or 2-chlorothioxanthone; azides and acylphosphene oxides, such as, e.g., 2,4,6-trimethylbenzoyldiphenylphosphine oxide. Other examples of suitable photoinitiators are oxime esters, particularly as named in U.S. Pat. No. 5,019,482, whose description is considered as a part of the present description, as well as photoinitiator systems containing ketocoumarin derivatives as well as amines as activators, such as is described in detail, e.g., in U.S. Pat. No. 4,366, 228, whose description is also considered a component of the present description.

Preferably the titanocenes known, for example, from EP-A 0 119,162 are utilized as photoinitiators b), particularly titanocenes of formulas (IV) to (VII):

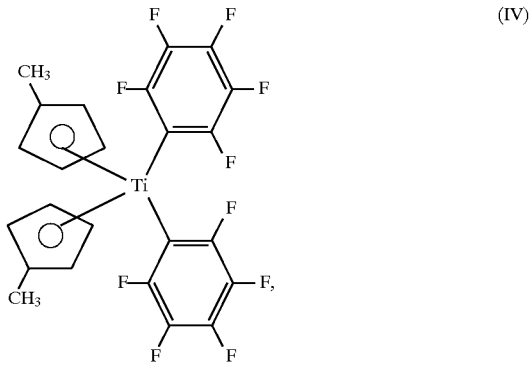

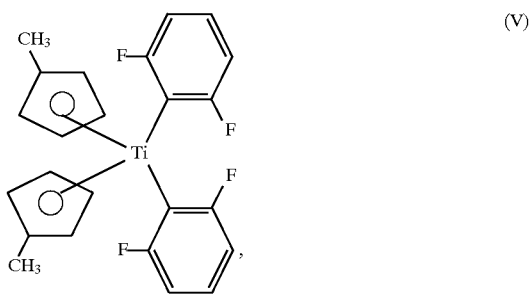

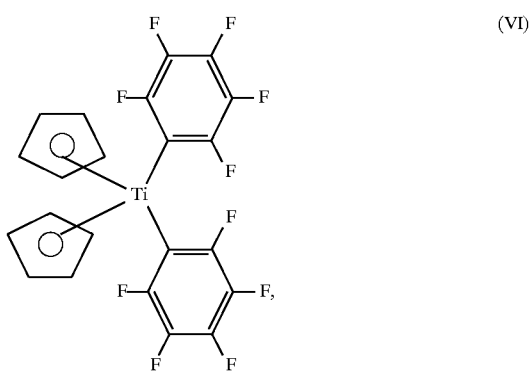

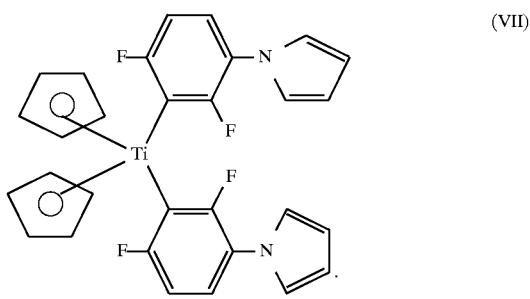

Other preferred photoinitiators, which may be utilized in the process of the invention, are the oxime esters disclosed, for example, in U.S. Pat. No. 5,019,482. With the use of several specific triketone oxime esters, no dark coloring of the mixture occurs upon heating to high temperatures. These particularly preferred triketoxime esters have the formula (VIII):

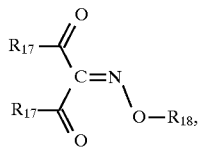

(VIII)

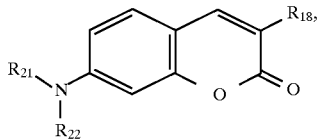

(X)

in which the residues $R_{17}$, independent of one another, stand for p-tolyl, p-alkoxyphenyl or mesityl, and $R_{18}$ indicates $C_1$–$C_6$-alkylcarbonyl, $C_1$–$C_6$-alkoxy-carbonyl, $C_6$–$C_{14}$-arylcarbonyl or $C_6$–$C_{14}$-aryloxycarbonyl. The triketone oxime esters of formula (VIII) may be produced according to known methods, e.g., by converting the corresponding triketones to oximes (e.g., according to "Organic Synthesis", Vol. 40, pages 21–23) and subsequent conversion with acid chlorides or chlorocarbonic acid esters. In very particularly preferred compounds of formula (VIII), $R_{17}$ stands for p-tolyl and $R_{18}$ stands for $C_6$–$C_{14}$-arylcarbonyl. The compound of formula (VIIIa) is particularly preferred:

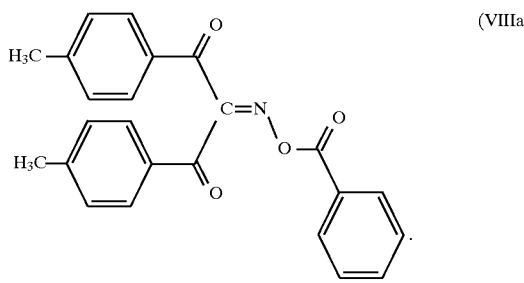

(VIIIa)

Appropriately, the compositions of the invention contain 1–10 wt. % of component (b) relative to component (a).

The triketoxime esters of formula (VIII) are preferably used in combination with an aromatic amine of formula (IX):

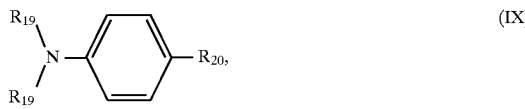

(IX)

in which the two $R_{19}$ residues, independent of one another, stand for $C_1$–$C_3$ alkyl or $C_1$–$C_3$-hydroxyalkyl or form together with the N atom a morpholine group, and $R_{20}$ represents a $C_1$–$C_3$ alkyl group, $C_2$–$C_5$ alkylcarbonyl group, or $C_7$–$C_{10}$ arylcarbonyl group. Suitable aromatic amines of formula (IX) are, for example, 4-dimethylaminoacetophenone, 4-morpholinoacetophenone, 4-dimethylaminobenzophenone, 4-morpholinobenzophenone, N-phenyldiethanolamine, N-p-tolyldiethylamine, and N-p-tolyldiethanolamine. The aromatic amines of formula (IX) are added appropriately in a quantity of 0.5–5 wt. % relative to component (a).

The named triketoximes and triketoxime/amine mixtures are particularly suitable for an exposure with irradiation of the mercury i-line. By the additional use of photosensitizers, one can also produce photosensitivity in other spectral regions, e.g., at the wavelength of the g-line (436 nm). For example, a coumarin of formula (X):

can be added, in which $R_{21}$ and $R_{22}$, independent of one another, are $C_1$–$C_6$ alkyl groups and $R_{18}$ indicates $C_1$–$C_6$ alkylcarbonyl, $C_1$–$C_6$ alkoxycarbonyl, $C_6$–$C_{14}$ arylcarbonyl, or $C_6$–$C_{14}$ aryloxycarbonyl.

Preferably, the coumarins disclosed in U.S. Pat. No. 5,019,482 and particularly those given as examples, are utilized. Particularly preferred is the coumarin of formula (Xa):

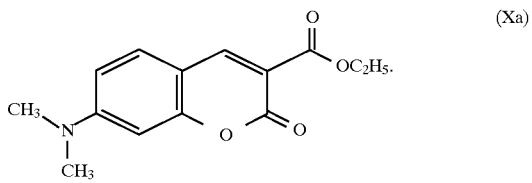

(Xa)

The coumarins of formula (X) are generally used in a quantity of 0.1–5 wt. % with respect to component (a). Another particularly preferred coumarin has the formula (XI):

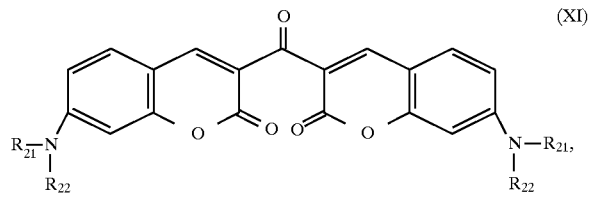

(XI)

in which $R_{21}$ and $R_{22}$ stand for a methyl or an ethyl group. In addition, this coumarin derivative is appropriately used in a quantity of 0.1 to 5 wt. % relative to component a).

The photosensitivity of the compositions of the invention may be further increased by the addition of aromatic heterocyclic compounds, which contain at least one mercapto group. Examples of such compounds are 2-mercaptobenzimidazole, 2-mercaptobenzothiazole, 1-phenyl-5-mercapto-1H-tetrazole, 2-mercapto-4-phenylthiazole, 2-amino-5-mercapto-4-phenylthiazole, 2-amino-4-mercapto-1,3,4-thiazole, 2-mercaptoimidazole, 2-mercapto-5-methyl-1,3,4-thiazole, 5-mercapto-1-methyl-1H-tetrazole, 2,4,6-trimercapto-s-triazine, 2-dibutylamino-4,6-dimercapto-s-traizine, 2,5-dimercapto-1,3,4-thiadiazole, 5-mercapto-1,3,4-thiadiazole, 1-ethyl-5-mercapto-1,2,3,4-tetrazole, 2-mercapto-6-nitrothiazole, 2-mercaptobenzoxazole, 4-phenyl-2-mercaptothiazole, mercaptopyridine, 2-mercaptoquinoline, 1-methyl-2-mercaptoimidazole and 2-mercapto-β-naphthothiazole. Such mercapto compounds are generally used in a quantity of 0.5–5 wt. % with respect to component (a). Preferably, 2-mercaptobenzothiazole is used.

Another special form of embodiment of the invention contains a coumarin of formula (XII) as a photoinitiator system:

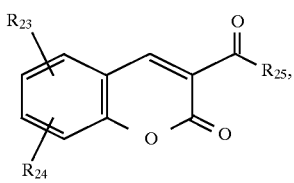

in which $R_{23}$ and $R_{24}$, independent of one another, indicate hydrogen or $C_1$–$C_6$ alkoxy and $R_{25}$ stands for $C_6$–$C_{14}$ aryl or a residue of formula (XIII):

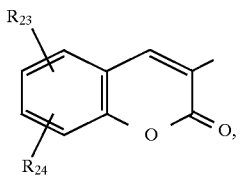

in which $R_{23}$ and $R_{24}$ again have the same meaning as in formula (XII), in mixture with an amino acid of formula (XIV):

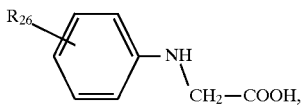

in which $R_{26}$ stands for hydrogen, methyl, ethyl, i-propyl, t-butyl, phenyl, methoxy, ethoxy, hydroxy, hydroxymethyl, dimethylamino, diethylamino, acetyl, propionyl, acetyloxy, propionyloxy, —NHCONH$_2$ or —NHCOOCH$_3$. The coumarins of formula (XII) are known, for example, from U.S. Pat. No. 4,278,751. Preferably they are coumarins of formula (XII), in which one of the residues $R_{23}$ or $R_{24}$ indicates methoxy. Particularly preferred is 3-benzoyl-7-methoxycoumarin. In addition, amino acids of formula (XIV) are known and are described, for example, in JP-A Hei 03-170,551. Preferably N-phenylglycine is used. Corresponding compounds according to the invention generally contain 0.2–5 wt. % coumarin of formula (XII), 0.5–10 wt. % amino acids of formula (XIV), relative to component (a).

Other suitable sensitizers, which may be used particularly in combination with the coumarins of formula (XII), are those oxazolones described in JP-A-Hei 03-170,552, particularly oxazolones of formula (XV):

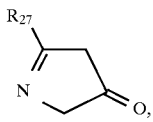

in which $R_{27}$ stands for a group of formulas (XVI) or (XVII):

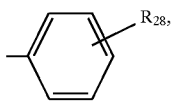

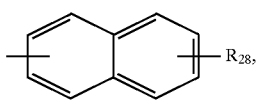

in which $R_{28}$ indicates hydrogen, methyl, ethyl, n-propyl, i-propyl, n-butyl, t-butyl, phenyl, hydroxy, methoxy, ethoxy, n-propoxy, n-butoxy, phenoxy, benzyl, 2-phenylethyl, hydroxymethyl, 2-hydroxyethyl, acetyl, propionyl, acetyloxy, propionyloxy, aminomethyl, 2-aminoethyl, methylamino, dimethylamino, diethylamino, —CONH$_2$, —CONHCH$_3$, —CON(CH$_3$)$_2$, —CONHC$_2$H$_5$ or —CON(C$_2$H$_5$)$_2$. Preferred oxazolone is 3-phenyl-5-isooxazolone.

Compounds of the invention based on the named preferred photoinitiators or initiator systems are particularly suitable for the production of relief structures with radiation of the mercury i-line, due to their high transparency in the i-line range. Since the compounds, however, also have a high photosensitivity in the far region of approximately 200 nm to approximately 600 nm, their use is not limited to i-line exposure. Rather, actinic radiation of very different wavelengths can be utilized; broadband exposure is also possible, as is irradiation with discrete wavelengths (e.g., g-line).

A special form of embodiment of the negative resists of the invention contains as another component d) an acrylic or methacrylic acid ester of aromatic or aliphatic polyols, an allyl ether of aromatic or aliphatic polyols or an allyl ester of aromatic or aliphatic polycarboxylic acids.

For example, ethers and particularly esters and partial esters of acrylic acid or methacrylic acid and aromatic and particularly aliphatic polyols particularly with 2–30C atoms or cycloaliphatic polyols with preferably 5 or 6 ring carbons are considered as component d). These polyols may be modified also with epoxides, such as ethylene oxide or propylene oxide. Further, esters and partial esters of polyoxyalkylene glycols are also suitable.

Examples of suitable component d) are: ethylene glycol diacrylate, ethylene glycol dimethacrylate, diethylene glycol diacrylate, diethylene glycol dimethacrylate, triethyleneglycol diacrylate, triethylene glycol dimethacrylate, tetraethylene glycol diacrylate, tetraethylene glycol dimethacrylate, polyethylene glycol di(meth)acrylates with an average molecular weight in the range of 200–2000, trimethylolpropane ethoxylate tri(methacrylate), trimethylolpropane polyethoxylate tri(meth)acrylates with an average molecular weight in the range of 500–1500, pentaerythrite tri(meth)acrylate, pentaerythrite di(meth)acrylate, pentaerythrite tetra(meth)acrylate, dipentaerythrite di(meth)acrylate, dipentaerythrite tri(meth)acrylate, dipentaerythrite tetra(meth)acrylate, dipentaerythrite hexa(meth)acrylate, tripentaerythrite octa(meth)acrylate, 1,3-butanediol di(meth)acrylate, sorbite tri(meth)acrylate, sorbite tetra(meth)acrylate, sorbite penta(meth)acrylate, sorbite hexa(meth)acrylate, oligoester(meth)acrylates, glycerin di(meth)acrylate, glycerin tri(meth)acrylate, 1,4-cyclohexane di(meth)acrylate, bis(meth)acrylates of polyethylene glycols with an average molecular weight in the range of 500–1500, ethylene glycol diallylether, trimethylolpropane triallyl ether, pentaerythrite triallyl ether, succinic acid and adipic acid diallyl ethers or mixtures of the named compounds.

The compositions of the invention contain component a) preferably in a quantity of 20 to 80 wt. %, particularly 40 to 70 wt. % and very particularly 50 to 65 wt. % relative to the total weight of components a), b), c) and d). Photoinitiator b) is preferably added in a quantity of 0.1 to 20 wt %, particularly 0.5 to 10 wt. %, component c) in a quantity of 30 to 45 wt. %, also with respect to the total weight of components a), b), c) and d). If it is present, component d) is preferably added in a quantity of 3 to 50 wt. %, especially 10 to 35 wt. %, again with respect to the total weight of components a), b), c), and d). Of course, only those combinations with percentages of individual components, which total in all 100%, are permitted.

The photosensitive composition may also contain other additives, e.g., stabilizers, particularly inhibitors of thermal polymerization, such as thiodiphenylamine and alkyl phenols, e.g., 4-tert-butylphenol, 2,5-di-tert-butyl hydroquinone, or 2,6-di-tert-butyl-4-methylphenol. Other suitable initiators and sensitizers are, e.g., aromatic ketones, such as tetramethyldiaminobenzophenone, benzophenone, Michler's ketone and other aromatic ketones, e.g., the compounds mentioned in U.S. Pat. No. 3,552,973, benzoin, benzoin ethers, such as, for example, benzoin methyl ether, methylbenzoin, ethylbenzoin, p-maleinimidobenzenesulfonic acid azide, thioxanthone derivatives, such as thioxanthone, 2-chlorothioxanthone or 2-isopropylthioxanthone or bisazides, such as, e.g., 2,6-(4'-azidobenzylidene-4)-methylcyclohexan-1-one.

Other additives include solvents, which may be used alone or in combinations, such as, e.g., N-methylpyrrolidone, γ-butyrolactone, ethylene glycol monomethyl ether, cyclopentanone, dimethylformamide, dimethyl acetamide, and hexamethylphosphoric acid triamide; pigments, colorants, fillers, adhesive agents, wetting agents, and softeners [plasticizers], as well as colorants, which can influence the spectral sensitivity of the mixtures due to their specific absorption.

The production of the photosensitive compositions is conducted by mixing the components in conventional equipment for this.

The photosensitive compositions are excellently suitable as coating agents for substrates of all types, e.g., ceramics, metals, such as copper or aluminum, semimetals and semiconductor materials, such as silicon, germanium, GaAs, $SiO_2$ and $Si_3N_4$ layers, in which a structured protective layer or a photographic image will be introduced by photopolymerization and subsequent treatment of the coating with a developer.

As has already been mentioned above, the negative photoresists of the invention, when compared with conventional negative resists based on polyimide primers of formula (I) have the great advantage that they can be developed with developers that comprise at least an essential part, e.g., up to 50 to 100 wt. %, preferably 75 to 100 wt. %, of aqueous-alkaline media, whereby "aqueous-alkaline media" mixtures are to be understood as those that are comprised essentially or preferably completely of water and alkaline reacting chemical compounds. "Can be developed" further preferably indicates that a 10-μm thick layer of resist can be completely removed from the substrate in 5 minutes at most with a developer, as defined above. Preferred aqueous-alkaline media are conventional aqueous-alkaline developers, such as those that are used, e.g., for development of conventional positive photoresists based on 1,2-diazonaphthoquinones and phenolic binders, such as novolaks. Such developers are well known to the expert and contain as alkaline compounds, e.g., sodium or potassium hydroxides, the corresponding carbonates, bicarbonates, silicates, metasilicates, but preferably metal-free bases, such as ammonia or amines, e.g., ethylamine, n-propylamine, diethylamine, di-n-propylamine, triethylamine, methyldiethylamine, alkanolamines, e.g., dimethylethanolamine, triethanolamine, quarternary ammonium hydroxides, e.g., tetramethylammonium hydroxide (TMAH) or tetraethylammonium hydroxide. Suitable aqueous-alkaline developer solutions are generally up to 0.5N relative to alkali, but can also be diluted in a suitable way prior to use. For example, aqueous-alkaline solutions with a normality of approximately 0.15 to 0.4, preferably from 0.20 to 0.35 can be well used. The balance up to 100 wt. % in the case of developers that are suitable for the compositions of the invention will be formed by one or more organic solvents, e.g., by N-methylpyrrolidone (NMP), N-acetylpyrrolidone, γ-butyrolactone, ethylene glycol monomethyl ether, dimethylformamide, dimethyl acetamide, dimethyl sulfoxide and cyclohexanone, toluene, xylene, ethanol, methanol, isopropanol, n-butyl acetate or acetone or mixtures of such solvents. Isopropanol is preferably used as a single organic solvent.

The invention further concerns a process for the production of relief images, comprising the following steps:

(A) Coating a substrate with a negative photoresist composition, as described above;

(B) Image exposure of the coated substrate, (C) Removal of the unexposed places by means of a developer, which at least essentially comprises aqueous-alkaline media.

The production of the coated substrate can be conducted, for example, by preparing a solution or suspension of the composition. The solvent and the concentration are selected primarily on the basis of the type of composition and according to the coating process. The solution is introduced uniformly by means of known coating processes onto a substrate, e.g., by spinning, dipping, wipe coating, suspension casting methods, brushing, spraying, particularly by electrostatic spraying and reverse-roll coating. It is also possible to introduce the light-sensitive layer onto a temporary, flexible substrate and then to coat the final substrate, e.g., a copper-laminated printed circuit board, by layer transfer via lamination.

The quantity applied (layer thickness) and type of substrate (layer carrier) are dependent on the desired field of application. It is particularly advantageous that the photosensitive compositions can be applied in very variable layer thicknesses. This range of layer thicknesses comprises values from approximately 0.5 μm to more than 100 μm.

The photopolymerization of (meth)acrylates and similar olefin unsaturated compounds is blocked, as is known, by oxygen in air, particularly for thin layers. This effect can be avoided with known conventional methods, such as, e.g., introducing a temporary coating layer of polyvinyl alcohol or by preexposure or preconditioning under inert gas.

After coating, the solvent is usually removed by drying, and a layer of photosensitive composition results on the carrier.

After this, image exposure of the material is produced in the usual way with radiation. The wavelength of the radiation to be used, is dependent on the special composition, particularly of the photoinitiator used and if necessary, the sensitizers also used, as usual. The wavelength of suitable radiation generally lies between 200 and 600 nm, preferably between 300 and 450 nm.

After exposure, the unexposed places of the photosensitive resist are removed in the usual way by treatment with a developer, as is described further above.

After development, a firing of the exposed and developed material is conducted preferably according to (D). Firing is conducted preferably at temperatures between 300° C. and 400° C., whereby the polyimide primers are converted into heat-resistant polyimides and volatile components are removed, so that relief structures that are stable at high temperatures are obtained.

The process of the invention is characterized by a high sensitivity upon exposure and produces relief structures that are resistant to heat and chemicals with high contour definition. With this process, e.g., structures with ultrasmall dimensions of 8 to 10 μm can be resolved without anything further, if the coating thickness amounts to 10 μm.

Possible fields of application of the process of the invention are the use as photoresists for electronics (electroresist, etching resist, soldering top resist), the production of printing plates, such as offset printing plates or screen printing forms, application in preform etching, and particularly, the production of polyimide protective resists and dielectric layers in electronics, particularly in microelectronics.

The invention thus also concerns a process for the production of an electronic component, whereby this process comprises a process for the production of relief images, as was described above.

The present invention is further illustrated by the following Examples. All parts and percentages are by weight and all temperatures are degrees Celsius unless explicitly stated otherwise.

EXAMPLE 1

A negative resist composition, prepared by mixing:

| | |
|---|---|
| 29.2 wt. % | Photoreactive polyimide primer (component a) with Mw approximately 25,000, produced from pyromellitic acid dianhydride (=PMDA) 4,4'-diaminodiphenyl ether (=ODA) and methacrylic acid-2-hydroxyethyl ester |
| 1.02 wt. % | Titanocene according to formula (VII) (component b) |
| 11.68 wt. % | Diphenylsilanediol (component c1) |
| 5.84 wt. % | 3-(o-hydroxybenzoyloxy)-2-(hydroxy)propylmethacrylate (component c2) |
| 4.38 wt. % | Polyethyleneglycol-200 diacrylate (component d) |
| 0.06 wt. % | 1,4-Benzoquinone |
| 0.18 wt. % | 3,3'-carbonylbis(7-diethylaminocoumarin) |
| 47.64 wt. % | N-methylpyrrolidone (NMP) | is rolled overnight into clear resin solution and then subjected to a pressure filtration through a filter of pore width 0.8 $\mu$m. The resin solution is spun onto silicon wafers pretreated with the bonding agent aminopropyltriethoxysilane (5000 rpm, 30 sec) and the coated wafers are then dried for 5 min at 100° C. on a hot plate. In this way, 10-$\mu$m thick uniform polymer layers are obtained on the silicon wafers.

The wafers are then exposed with an exposure machine of the type Karl Süss MA 150 in vacuum contact, whereby a Siemens chromium mask with positive/negative structures is used. The exposure is conducted with a mercury ultrahigh-pressure lamp and the irradiation power is measured with an OAl power meter and the 405-nm probe. After exposure, the image is developed with a mixture of 8 volumetric parts of an aqueous 0.262N solution of tetramethylammonium hydroxide (TMAH) and 2 volumetric parts of isopropanol for 3 min, and then washed with water. In the case of the described process, an exposure energy of 200 mJ/cm$^2$ is necessary in order to produce good structures. Highly resolved relief structures with good contour definition are obtained, whereby 10-$\mu$m wide lines can be resolved.

EXAMPLE 2

A negative resist composition, prepared by mixing:

| | |
|---|---|
| 32.07 wt. % | Photoreactive polyimide primer with $M_W$ approximately 13,000, produced from PMDA, ODA, and methacrylic acid-2-hydroxyethyl ester |
| 1.12 wt. % | Titanocene according to formula (VII) |
| 12.83 wt. % | Diphenylsilanediol |
| 6.41 wt. % | 3-(o-hydroxybenzoyloxy)-2-(hydroxy)propylmethacrylate |
| 4.81 wt. % | Polyethyleneglycol-200 diacrylate |
| 0.06 wt. % | 1,4-Benzoquinone |
| 0.19 wt. % | 3,3'-carbonylbis(7-diethylaminocoumarin) |
| 42.51 wt. % | NMP | is rolled overnight into a clear resin solution and then subjected to a pressure filtration through a filter of pore width 0.8 $\mu$m. The resin solution is spun onto silicon wafers pretreated with the bonding agent g[gamma]-aminopropyltriethoxysilane (3500 rpm, 30 sec) and the coated wafers are then dried for 5 min at 100° C. on a hot plate. Then 10-$\mu$m thick uniform polymer coatings are obtained on the silicon wafers.

The wafers are then exposed with an exposure machine of the type Karl Süss MA 150 in vacuum contact, whereby a Siemens chromium mask with positive/negative structures is used. The exposure is conducted with a mercury ultrahigh-pressure lamp, the radiation power is measured with an OAl power meter and the 405-nm probe. After exposure, this image is developed for 1.5 min with the same developer as was used in Example 1, and then washed with water. In the described method, an exposure energy of 200 mJ/cm$^2$ is necessary in order to produce good structures. Highly resolved relief structures with good contour definition are obtained, whereby 10-$\mu$m wide lines can be resolved.

EXAMPLE 3

A negative resist composition, produced by mixing:

| | |
|---|---|
| 32.07 wt. % | Photoreactive polyimide acid ester with $M_W$ approximately 13,000, produced from PMDA, ODA, and methacrylic acid-2-hydroxyethyl ether |
| 1.12 wt. % | Titanocene according to formula (VII) |
| 6.41 wt. % | 3-(o-hydroxybenzoyloxy)-2-(hydroxy)propylmethacrylate |
| 4.81 wt. % | Polyethyleneglycol-200 diacrylate |
| 0.06 wt. % | 1,4-Benzoquinone |
| 0.19 wt. % | 3,3'-carbonylbis(7-diethylaminocoumarin) |
| 42.51 wt. % | NMP | is processed analogously to Example 2. After the exposure, unlike Example 2, the image is developed with a mixture of 8 volumetric parts of an aqueous 0.331N solution of tetramethylammonium hydroxide and 2 volumetric parts of isopropanol for 5 min and then washed with water. Highly resolved relief structures with good contour definition are also produced, whereby 10-$\mu$m wide lines can be resolved.

EXAMPLE 4

A negative resist composition, produced by mixing:

| | |
|---|---|
| 32.78 wt. % | Photoreactive polyimide primer with $M_W$ approximately 13,000, produced from PMDA, ODA, and methacrylic acid-2-hydroxyethyl ether |
| 1.29 wt. % | Titanocene according to formula (VII) |
| 7.36 wt. % | 3-(o-hydroxybenzoyloxy)-2-(hydroxy)propylmethacrylate |
| 5.52 wt. % | Polyethyleneglycol-200 diacrylate |
| 0.07 wt. % | 1,4-Benzoquinone |
| 0.22 wt. % | 3,3'-carbonylbis(7-diethylaminocoumarin) |
| 48.76 wt. % | NMP | is processed analogously to application Example 2 up to exposure. After exposure, the image is developed with a mixture of 8 volumetric parts of an aqueous 0.385N (3.5%) solution of tetramethylammonium hydroxide and 2 volumetric parts of isopropanol for 2 min and then washed with water. For the described process, an exposure energy of 200 mJ/cm² is necessary in order to produce good structures. Highly resolved relief structures with good contour definition are obtained, whereby 10-μm wide lines can be resolved.

While the invention has been described above with reference to specific embodiments thereof, it is apparent that many changes, modifications, and variations can be made without departing from the inventive concept disclosed herein. Accordingly, it is intended to embrace all such changes, modifications, and variations that fall within the spirit and broad scope of the appended claims. All patent applications, patents, and other publications cited herein are incorporated by reference in their entirety.

What is claimed is:

1. Negatively operating photoresist composition containing:

a) a polyimide primer containing recurring structural units of formula (I)

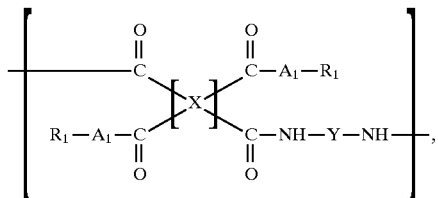

in which $A_1$ stands for an oxygen atom or an NH group, $R_1$ represents the same or different residues with a photopolymerizable olefin double bond,

[X] indicates the residue of the cyclic dianhydride of the same or different tetracarboxylic acids remaining after removal of the anhydride groups, and Y indicates the residue of the same or different diamines remaining after removal of the amino groups, as well as b) a photoinitiator for polymerizing olefin double bonds, which is further characterized as containing at least one other component, c) which is selected from the group consisting of c1) organosilicon compounds with one or more hydroxyl groups, c2) compounds of formula (IIa)

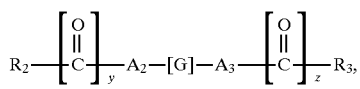

in which $A_2$ and $A_3$, independent of one another, stand for an oxygen atom or a NR group, in which R indicates a hydrogen atom or a $C_1$–$C_4$ alkyl group, and

[G] stands for a divalent aliphatic or aromatic group, which is unsubstituted or has one or more hydroxyl substituents, $R_2$ indicates an aryl residue, which has one or more acid substituents that improve the solubility of the photoresist composition in aqueous-alkaline media, $R_3$ represents a residue with at least one photopolymerizable olefin double bond, and y as well as z, independent of one another, indicate the number 0 or 1, and c4) mixtures consisting of two or more components selected from components of c1), c2), and c3), wherein c3) is compounds of formula (IIb)

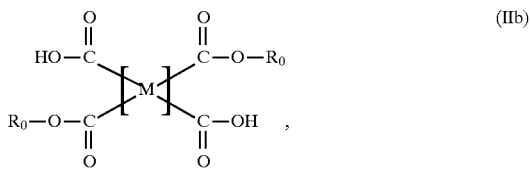

in which $R_0$ represents the same or different residues with a photopolymerizable olefin double bond, and

[M] represents the residue of the cyclic dianhydride of a tetracarboxylic acid remaining after removal of the anhydride groups.

2. Composition according to claim 1, further characterized in that component c1) is selected from the group consisting of organosilanols and organosiloxanes, each of which have one or two hydroxyl groups.

3. Composition according to claim 2, further characterized in that component c1) is selected from the group consisting of triphenylsilanol, diphenylsilanediol, 1,4-bis(hydroxydimethylsilyl)benzene and 1,3-bis(4-hydroxybutyl)tetramethyldisiloxane.

4. Composition according to claim 1, further characterized in that component c2) is selected from the group consisting of compounds of formula (IIa), in which $R_2$ indicates a phenyl residue, which has one to three substituents selected from HO and HOOC substituents.

5. Composition according to claim 1, further characterized in that component c2) is selected from the group consisting of compounds of formula (IIa), in which [G] stands for a $C_2$–$C_6$ alkylene group, which is either unsubstituted or has one or more hydroxyl substituents.

6. Composition according to claim 5, further characterized in that component c2) is selected from the group consisting of compounds of formula (IIa), in which [G] stands for a group of formula:

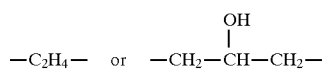

7. Composition according to claim 1, further characterized in that component c2) is selected from the group consisting of compounds of formula (IIa), in which $R_3$ stands for a vinyl or for an isopropenyl group.

8. Composition according to claim 1, further characterized in that component c2) is selected from the group consisting of compounds of formula (IIa) in which $R_2$ stands for a group selected from the groups of the following formulas:

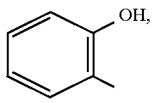

-continued

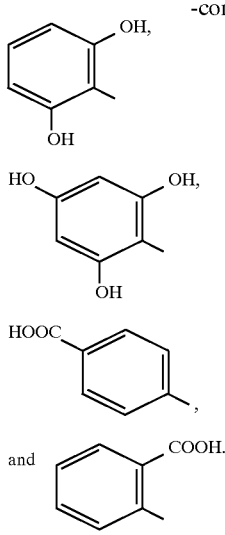

9. Composition according to claim 1, further characterized in that component c2) is selected from the group consisting of compounds of formula (IIa), in which $A_2$ and $A_3$ both stand for an oxygen atom, and in which y and z indicate the number 1.

10. Composition according to claim 1, further characterized in that it contains component c1) in a quantity of 0 to 30 wt. %, whereby this value is referred to the total weight of components a)+c) in the composition.

11. Composition according to claim 1, further characterized in that it contains component c2) in a quantity of 0 to 30 wt. %, whereby this value is referred to the total weight of components a)+c) in the composition.

12. Composition according to claim 1, further characterized in that it contains as component c) a mixture of c4), which comprises at least one component of c1) as well as at least one component of c2).

13. Composition according to claim 1, further characterized in that it contains component c3) in a quantity of 0 to 30 wt. %, whereby this value is referred to the total weight of components a)+c) in the composition.

14. Composition according to claim 1, further characterized in that it contains, as another component d), an acrylic or methacrylic acid ester of aromatic or aliphatic polyols, an allyl ether of aromatic or aliphatic polyols, or an allyl ester of aromatic or aliphatic polycarboxylic acids.

15. Process for the production of relief images comprising the following steps:
   (A) Coating a substrate with a negative photoresist composition, according to claim 1;
   (B) Imagewise irradiation of the coated substrate,
   (C) Removal of the unexposed places by means of a developer.

16. Process according to claim 15, comprising as a further process step:
   (D) The firing of the exposed and developed material.

17. Process for the production of an electronic component, whereby this process comprises a process for the production of relief images according to claim 15.

18. The process according to claim 15, wherein said developer contains up to about 50 to 100 wt. % of an aqueous-alkaline medium, whereby the balance up to 100 wt. % is formed by one or more organic solvents.

* * * * *